(12) United States Patent
Messier et al.

(10) Patent No.: US 12,360,181 B2
(45) Date of Patent: Jul. 15, 2025

(54) MULTI-DOMAIN DETECTOR BASED ON ARTIFICIAL NEURAL NETWORK

(71) Applicant: Allegro MicroSystems, LLC, Manchester, NH (US)

(72) Inventors: Loïc André Messier, Chene-en-Semine (FR); Christophe Lutz, Schwindratzheim (FR)

(73) Assignee: Allegro MicroSystems, LLC, Manchester, NH (US)

( * ) Notice: Subject to any disclaimer, the term of this patent is extended or adjusted under 35 U.S.C. 154(b) by 1077 days.

(21) Appl. No.: 17/235,183

(22) Filed: Apr. 20, 2021

(65) Prior Publication Data
US 2022/0334200 A1    Oct. 20, 2022

(51) Int. Cl.
*G01R 33/09* (2006.01)
*G06N 3/047* (2023.01)
*G06N 3/063* (2023.01)

(52) U.S. Cl.
CPC .............. *G01R 33/09* (2013.01); *G06N 3/047* (2023.01); *G06N 3/063* (2013.01)

(58) Field of Classification Search
CPC ......... G06N 3/047; G06N 3/063; G01R 33/09
See application file for complete search history.

(56) References Cited

U.S. PATENT DOCUMENTS

| | | | |
|---|---|---|---|
| 6,462,731 B1* | 10/2002 | Stoffers | G05G 9/047 345/161 |
| 11,023,808 B1* | 6/2021 | Jiang | G06F 18/214 |
| 12,060,082 B1* | 8/2024 | Garimella | B60W 30/18159 |

(Continued)

FOREIGN PATENT DOCUMENTS

| | | | | |
|---|---|---|---|---|
| CA | 3152200 A1 * | 12/2020 | | G01R 33/02 |
| CN | 110200549 A * | 9/2019 | | |

(Continued)

OTHER PUBLICATIONS

Yang Li, etc., "CFFN: Correlation Filter Neural Network for Visual Object Tracking", published via Proceedings of the Twenty-Sixth International Joint Conference on Artificial Intelligence, Aug. 19, 2017, retrieved Sep. 24, 2024. (Year: 2017).*

(Continued)

*Primary Examiner* — Shourjo Dasgupta
(74) *Attorney, Agent, or Firm* — Daly, Crowley, Mofford & Durkee, LLP

(57) ABSTRACT

A sensor, comprising: a magnetic field sensing module that is configured to generate a plurality of signals, each signal indicating a magnetic flux density of a different component of a magnetic field that is produced by a magnetic field source; a processing circuitry that is configured to: receive the plurality of signals from the magnetic field sensing module; evaluate a neural network based on the plurality of signals to obtain a plurality of probabilities, each of the plurality of probabilities indicating a likelihood of the magnetic field source being positioned in a different one of a plurality of positional domains; generate an output signal based on the plurality of probabilities, the output signal encoding an identifier of a current positional domain of the magnetic field source.

26 Claims, 12 Drawing Sheets

(56) References Cited

U.S. PATENT DOCUMENTS

| | | | | |
|---|---|---|---|---|
| 2009/0259609 A1* | 10/2009 | Dmytriw | ............... | G06N 3/02 |
| | | | | 706/22 |
| 2016/0086080 A1* | 3/2016 | Foong | ............... | A61B 5/062 |
| | | | | 706/25 |
| 2019/0049231 A1* | 2/2019 | Choi | ............... | G01B 7/004 |
| 2020/0356131 A1* | 11/2020 | O'Neill | ............... | G05G 9/047 |
| 2021/0015634 A1* | 1/2021 | Eslam Pour | ......... | A61F 2/3609 |
| 2021/0026874 A1* | 1/2021 | Ikeda | ............... | G06N 3/084 |
| 2021/0034982 A1* | 2/2021 | Sather | ............... | G06N 3/082 |
| 2021/0109197 A1* | 4/2021 | O'Keeffe | ............ | G01S 7/4816 |
| 2021/0110239 A1* | 4/2021 | Heinz | ............... | G06F 3/0362 |
| 2021/0279561 A1* | 9/2021 | Yoshida | ............... | G06N 3/08 |
| 2021/0339741 A1* | 11/2021 | Rezvan Behbahani | | ...................... |
| | | | | B60W 40/04 |
| 2021/0390367 A1* | 12/2021 | Liu | ............... | G06F 9/30105 |

FOREIGN PATENT DOCUMENTS

| | | | | |
|---|---|---|---|---|
| CN | 110222578 A | * | 9/2019 | ......... G06K 9/00442 |
| EP | 1438603 B1 | * | 3/2017 | ............. G01S 13/91 |
| JP | 2019136240 A | * | 8/2019 | |
| WO | WO-2016139135 A1 | * | 9/2016 | ............. G01D 5/145 |

OTHER PUBLICATIONS

Arbaaz Khan, etc., "Deep Learning for Magnetic Field Estimation", published in IEEE Transactions on Magnetics, vol. 55, No. 6, Jun. 2019, retrieved Sep. 24, 2024. (Year: 2019).*

Chang Seop Koh, etc., "Detection of Magnetic Body using Artificial Neural Network with Modified Simulated Annealing", published in IEEE Transactions on Magnetics, vol. 30, No. 5, Sep. 1994, retrieved Sep. 24, 2024. (Year: 1994).*

Ting-Hui Chiang, etc., "Magnetic Field-Based Localization in Factories Using Neural Network with Robotic Sampling", published in IEEE Sensors Journal, vol. 20, No. 21, Nov. 1, 2020, p. 13110 onward, retrieved Apr. 21, 2025. (Year: 2020).*

Faye Wu, etc., "Enhanced Magnetic Localization with Artificial Neural Network Field Models", published via 2013 IEEE International Conference on Robotics and Automation (ICRA), Karlsruhe, Germany, May 6-10, 2013, retrieved Apr. 21, 2025. (Year: 2013).*

Amirhoussein Mostajabi, etc., "Single-Sensor Source Localization Using Electromagnetic Time Reversal and Deep Transfer Learning: Application to Lightning", published in Scientific Reports, vol. 9, p. 17372, 2019, retrieved Apr. 21, 2025. (Year: 2019).*

U.S. Appl. No. 17/015,332, filed Sep. 9, 2020, Foroutan, et al.

* cited by examiner

- REGION #1

- REGION #2

- REGION #3

| TRAINING DATA 852 | LABEL 854 |
|---|---|
| SIGNATURE 1　852 | DOMAIN #1　854 |
| SIGNATURE 2　852 | DOMAIN #2　854 |
| SIGNATURE 3　852 | DOMAIN #1　854 |
| SIGNATURE 4　852 | DOMAIN #3　854 |
| SIGNATURE 5　852 | DOMAIN #3　854 |
| SIGNATURE N　852 | DOMAIN #7　854 |

FIG. 8B

MULTI-DOMAIN DETECTOR BASED ON ARTIFICIAL NEURAL NETWORK

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety.

SUMMARY

According to aspects of the disclosure, a sensor is provided, comprising: a magnetic field sensing module that is configured to generate a plurality of signals, each signal indicating a magnetic flux density of a different component of a magnetic field that is produced by a magnetic field source; a processing circuitry that is configured to: receive the plurality of signals from the magnetic field sensing module; evaluate a neural network based on the plurality of signals to obtain a plurality of probabilities, each of the plurality of probabilities indicating a likelihood of the magnetic field source being positioned in a different one of a plurality of positional domains; generate an output signal based on the plurality of probabilities, the output signal encoding an identifier of a current positional domain of the magnetic field source.

According to aspects of the disclosure, a method is provided, comprising: generating, by a magnetic field sensing module, a plurality of signals, each signal indicating a magnetic flux density of a different component of a magnetic field that is produced by a magnetic field source; evaluating a neural network based on the plurality of signals to obtain a plurality of probabilities, each of the plurality of probabilities indicating a likelihood of the magnetic field source being positioned in a different one of a plurality of positional domains; generating an output signal based on the plurality of probabilities, the output signal encoding an identifier of a current positional domain of the magnetic field source.

According to aspects of the disclosure, a sensor is provided, comprising: a sensing module configured to generate a plurality of signals, each of the signals indicating a magnetic flux density of a different component of a magnetic field that is produced by a magnetic field source; and a processing circuitry that is configured to: receive the plurality of signals; generate an output signal based on the plurality signals, the output signal encoding an identifier of a current positional domain of the magnetic field source, wherein the current positional domains of the magnetic field source is discontinuous.

According to aspects of the disclosure, a method is provided, comprising: a magnetic field sensing module that is configured to generate a plurality of signals, each signal indicating a magnetic flux density of a different component of a magnetic field that is produced by a magnetic field source; a processing circuitry that is configured to: receive the plurality of signals from the magnetic field sensing module; and generate an output signal based on the plurality signals, the output signal encoding an identifier of a current positional domain of the magnetic field source, wherein the current positional domains of the magnetic field source is discontinuous.

BRIEF DESCRIPTION OF THE DRAWINGS

The foregoing features may be more fully understood from the following description of the drawings in which:

FIG. 8B is a diagram of an example of a training data set, according to aspects of the disclosure;

DETAILED DESCRIPTION

Figure 1:
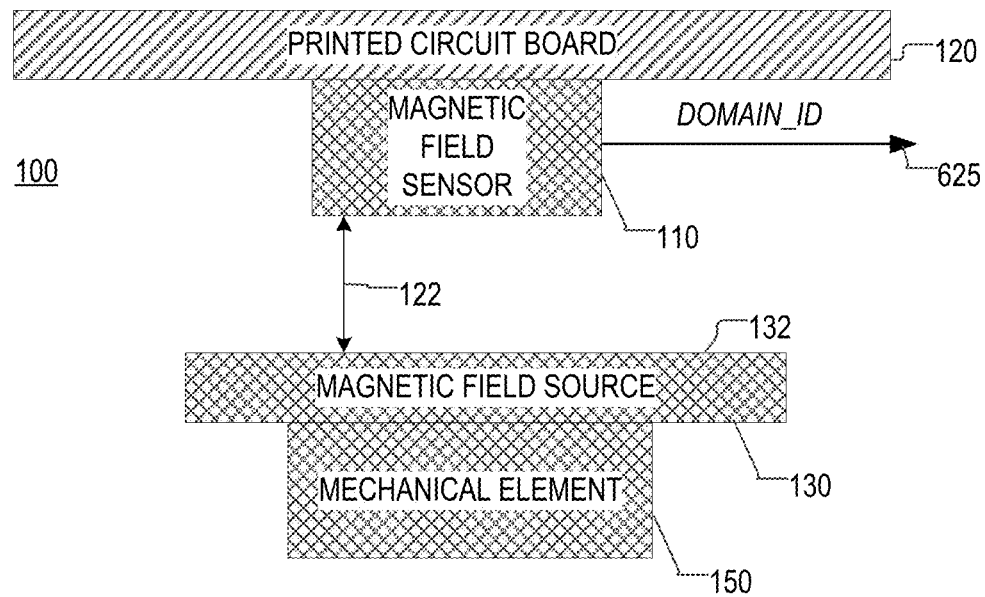
FIG. 1 is a diagram of an example of a system, according to aspects of the disclosure.

FIG. 1 is a diagram of an example of a system 100, according to aspects of the disclosure. The system 100 may include a sensor 110 that is mounted on a printed circuit board 120. The printed circuit board may be positioned above a magnetic field source 130 that is coupled to an element 150. The element 150 may be a rotating shaft, a gear, and/or any other suitable type of object. In some implementations, the element 150 may be part of a mechanical system, such as an automotive transmission, an industrial transmission, an electric motor, or an internal combustion engine. The magnetic field source 130 may include a permanent magnet, an electromagnet, a gear (in which eddy currents are induced), a metal object (in which eddy currents are induced), an antenna, a coil, and/or any other suitable type of magnetic field source. According to the present example, the magnetic field source 130 and/or the element 150 are configured to move relative to the sensor 110.

However, alternative implementations are possible in which the sensor 110 is arranged to move relative to the magnetic field source 130. According to the present example, the magnetic field source 130 has a top surface 132 and is spaced by an air gap 122 from the printed circuit board 120.

The sensor 110 may detect characteristics of the magnetic field produced by the magnetic field source 130 and determine a positional domain of the magnetic field source 130. Afterwards, the sensor 110 may generate a signal 625 that identifies the current positional domain of the magnetic field source 130. In some implementations, the signal 625 (see FIG. 6 for example) may be a digital signal. For instance, if the magnetic field source is situated in a first positional domain, the signal 625 may have the value of '1'; if the sensor 110 is situated in a second positional domain, the value of the signal 625 may be '2'; and if the sensor 110 is situated in a third positional domain, the value of the signal 625 may be '3'.

Figure 2:
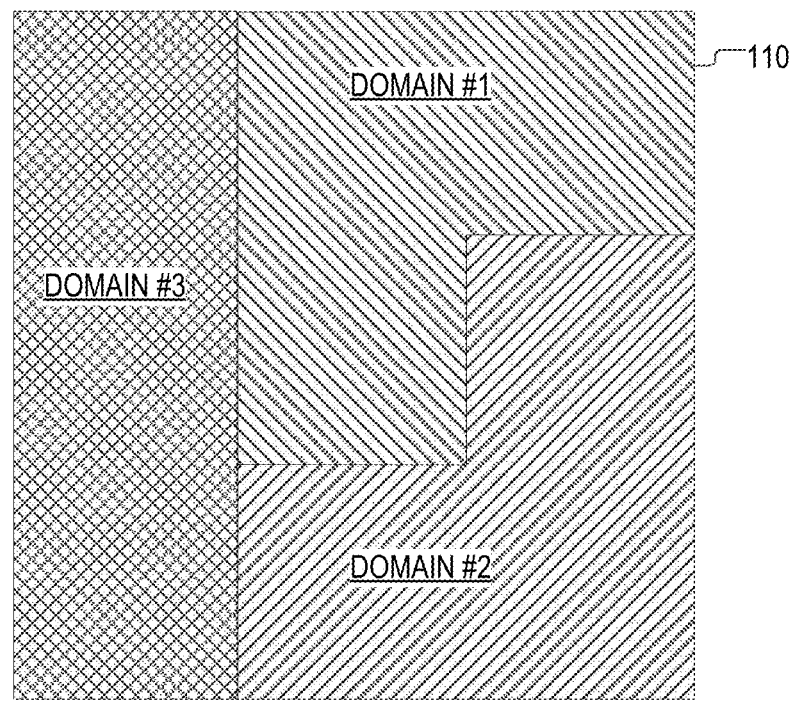
FIG. 2 is a diagram illustrating an example of a set of positional domains, according to aspects of the disclosure.
Figure 3C:
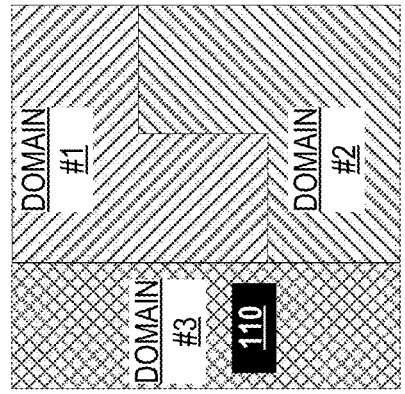
FIG. 3C is a diagram illustrating the operation of the system of FIG. 1, according to aspects of the disclosure.
Figure 3B:
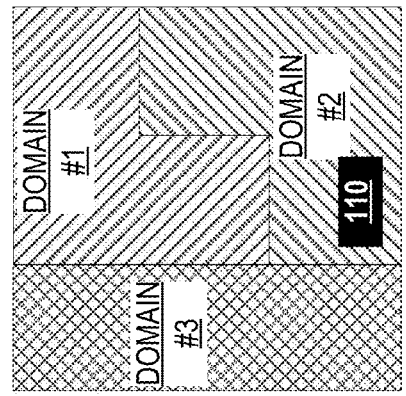
FIG. 3B is a diagram illustrating the operation of the system of FIG. 1, according to aspects of the disclosure.
Figure 3A:
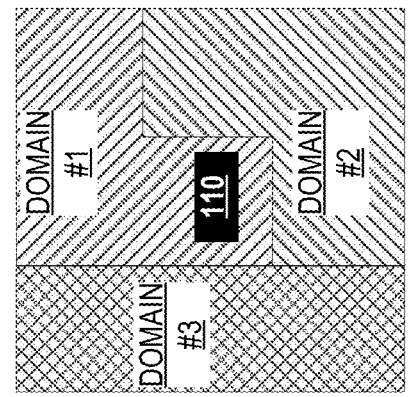
FIG. 3A is a diagram illustrating the operation of the system of FIG. 1, according to aspects of the disclosure.

The concept of positional domains is now discussed in further detail with respect to FIGS. 2-3D. FIG. 2 is a diagram of the top surface 132 of the magnetic field source 130. As illustrated, the top surface 132 may include a first region, a second region, and a third region. If the sensor 110 is situated directly above the first region (as a result of the magnetic field source 130 moving), the magnetic field source may be in a first positional domain (see FIG. 3A). If the sensor 110 is situated directly above the second region (as a result of the magnetic field source 130 moving), the magnetic field source may be in a second positional domain (see FIG. 3B). If the sensor 110 is situated directly above the third region (as a result of the magnetic field source 130 moving), the magnetic field source may be in a third positional domain (see FIG. 3C). In other words, FIGS. 2-3C illustrate an arrangement in which the top surface 132 of the magnetic field source 130 is divided into a set of regions, wherein each of the regions corresponds to a different positional domain. When any of the regions is in the closest proximity to the sensor 110 (among all other regions), magnetic field source 130 is said to be in that region's corresponding positional domain.

Figure 4:
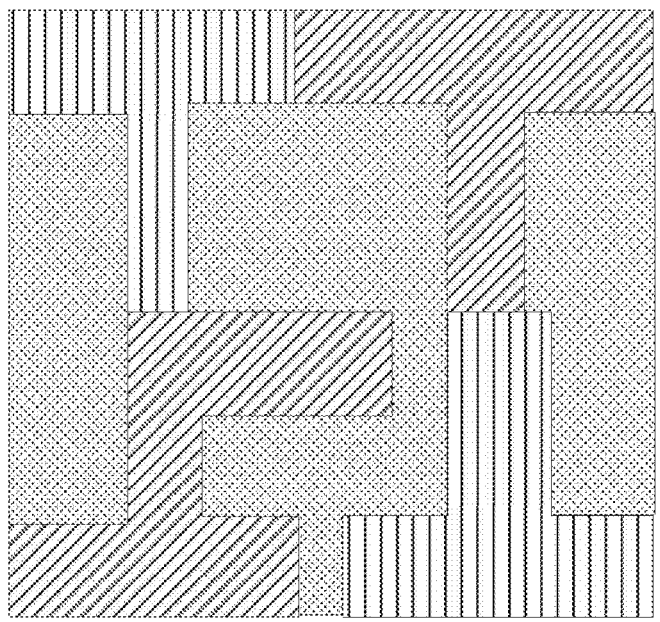
FIG. 4 is a diagram illustrating an example of another set of positional domains, according to aspects of the disclosure.
Figure 4:
Figure 4:
Figure 4:
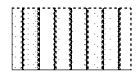

FIG. 4 is a diagram of a set of positional domains, in accordance with another implementation. According to the example of FIG. 4, the top surface 132 is divided into a first region (denoted region #1 in FIG. 4), a second region (denoted region #2 in FIG. 4), and a third region (denoted region #3 in FIG. 4). Unlike the example of FIGS. 2-3C, the regions shown in FIG. 4 are discontinuous. As used throughout the disclosure, the term "discontinuous region" shall refer to a region that includes at least a first portion and a second portion that are separated by space that is not part of the region.

Figure 5C:
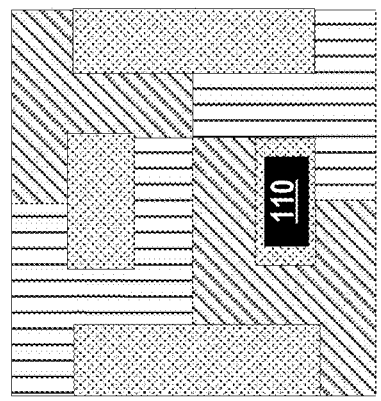
FIG. 5C is a diagram illustrating the operation of the system of FIG. 1, according to aspects of the disclosure.
Figure 5B:
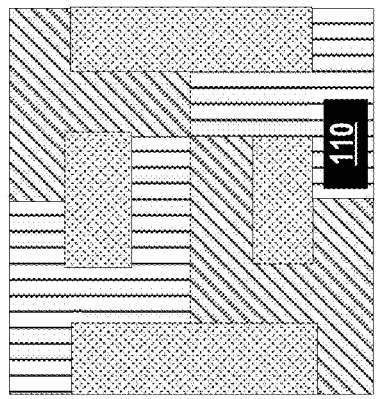
FIG. 5B is a diagram illustrating the operation of the system of FIG. 1, according to aspects of the disclosure.
Figure 5A:
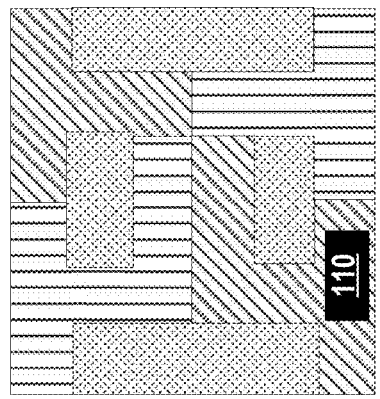
FIG. 5A is a diagram illustrating the operation of the system of FIG. 1, according to aspects of the disclosure.

Each of the discontinuous regions may correspond to a different positional domain of the magnetic field source 130. If the sensor 110 is situated directly above any portion of the first region (as a result of the magnetic field source 130 moving), the magnetic field source may be in a first positional domain (see FIG. 5A). If the sensor 110 is situated directly above any portion of the second region (as a result of the magnetic field source 130 moving), the magnetic field source may be in a second positional domain (see FIG. 5B). If the sensor 110 is situated directly above the third region (as a result of the magnetic field source 130 moving), the magnetic field source may be in a third positional domain (see FIG. 5C).

As used throughout the disclosure, the phrase "positional domain of a magnetic field source" may be interpreted as one of (i) "a set of positions of a magnetic field sensor relative to a magnetic field source" and/or (ii) "a set of positions of a magnetic field source relative to a magnetic field sensor." In other words, in some implementations, the sensor 110 may need to be directly above a particular portion of the top surface 132 of the magnetic field source 130 in order for the magnetic field source 130 to be in a particular positional domain. In the example of FIGS. 2A-4, the positional domains include two-dimensional positional domains, however, alternative implementations are possible in which each of the positional domains includes a 3-dimensional positional domain. Additionally or alternatively, further implementations are possible in which each of the positional domains includes a one-dimensional positional domain (e.g., a portion of a length of a linear path of a magnetic field source, etc.) A 3-dimensional positional domain may have a pyramidal shape and/or another shape in which the sidewalls are disposed at an angle relative to the plane of top surface 132 of the magnetic field source 130. From the point of view of the sensor 110, the positional domains (irrespective of whether they are one-dimensional, two-dimensional or three-dimensional) may appear as different classes, which magnetic signatures are classified into. Each of the classes may correspond to a two-dimensional positional domain and/or a three-dimensional positional domain. As is discussed further below, the classification may be performed by using a neural network. The neural network may be trained based on training data that maps training magnetic signatures to class identifiers. Each of the class identifiers may correspond to a different positional domain. Although in the example of FIG. 4, the positional domains correspond to different sections of the top surface of a magnetic field source, alternative implementations are possible in which the positional domains correspond to different sections of the plane of the top surface (or another plane, which may or may not be parallel to the plane of the top surface). In such implementations, the combined area of all positional domains that are recognized by the sensor 110 may be larger than the top surface of the magnetic field source 130. Stated succinctly, the present disclosure is not limited to any specific size and/or shape of the positional domains, which the sensor 110 is trained to recognize.

Figure 6A:
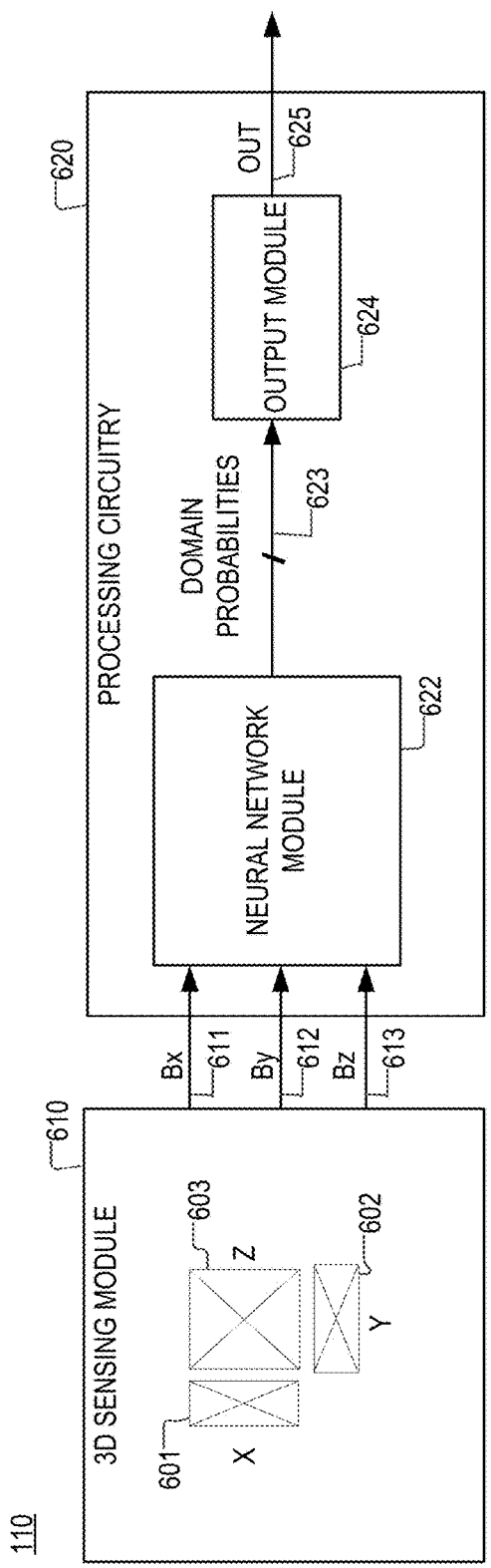
FIG. 6A is a diagram illustrating an example of a magnetic field sensor, according to aspects of the disclosure.
Figure 6B:
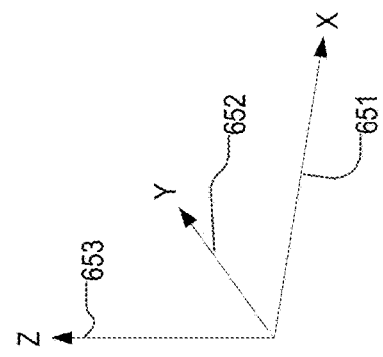
FIG. 6B is a diagram of an example of a coordinate system, according to aspects of the disclosure.

FIG. 6A is a diagram of the sensor 110, according to aspects of the disclosure. As illustrated, the sensor 110 may include a sensing module 610 and a processing circuitry 620.

The sensing module 610 may include sensing elements 601-603. The sensing element 601 may have a first axis of maximum sensitivity 651 (shown in FIG. 6B), and it may be configured to output a signal 611 that indicates the magnitude of a first component (e.g. an x-axis component) of the magnetic field that is produced by the magnetic field source 130. The sensing element 602 may have a second axis of maximum sensitivity 652 (shown in FIG. 6B), and it may be configured to output a signal 612 that indicates the magnitude of a second component (e.g. a y-axis component) of the magnetic field that is produced by the magnetic field source 130. The sensing element 603 may have a third axis of maximum sensitivity 653 (shown in FIG. 6B), and it may be configured to output a signal 613 that indicates the magnitude of a third component (e.g. a z-axis component) of the magnetic field that is produced by the magnetic field source 130. According to the example of FIGS. 6A-B, the first axis 651 is perpendicular to the second axis 652, and the third axis 653 is perpendicular to both the first axis 651 and the second axis 652.

Figure 7:
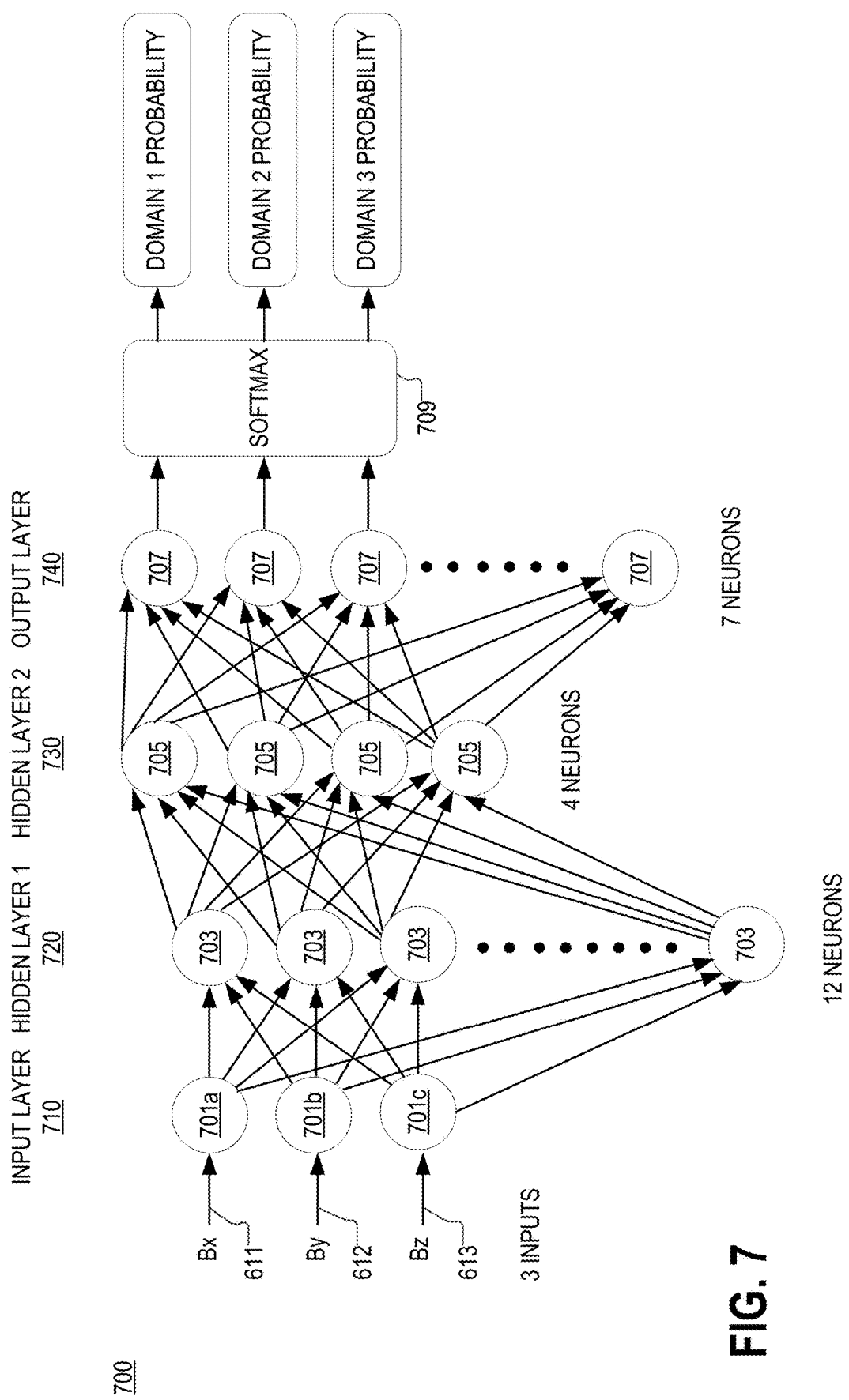
FIG. 7 is a diagram of an example of a neural network, according to aspects of the disclosure.

The processing circuitry 620 may include a neural network module 622 and an output module 624. The neural network module 622 may be configured to implement a neural network 700, which is shown in FIG. 7. The neural network module 622 may provide a signal 623 to the output module 624. The signal 623 may identify a set of probabilities. Each probability may indicate the likelihood of the magnetic field source 130 being in a respective positional domain. Each probability may be generated by a different output neuron of the neural network 700. The output module 624 may generate the signal 625 based on the signal 623. As noted above, according to the present example, the signal 625 may include an identifier of only one positional domain, which the largest one of the probabilities identified by the signal 623.

According to the example of FIG. 6A, the neural network module 622 includes electronic circuitry (e.g., digital logic) that is configured to perform the calculations defined by the neural network 700. Although in the example of FIG. 6A, the processing circuitry 620 uses application-specific circuitry (e.g., the neural network module 622) to evaluate the neural network 700, alternative implementations are possible in which the processing circuitry 620 includes a general-purpose processor or general-purpose processing circuitry. In such implementations, the neural network 700 may be implemented (on the sensor 110) in software or as a combination of software and hardware. Stated succinctly, the present disclosure is not limited to any specific method for evaluating the neural network 700.

According to the example of FIG. 6A, the output module 624 includes electronic circuitry that is configured to generate the signal 625. Although in the example of FIG. 6A, the output module is implemented in hardware, alternative implementations are possible in which the functions of the output module 624 are implemented in software or as a combination of hardware and software. Stated succinctly, the present disclosure is not limited to any specific implementation of the output module. Although in the example of FIG. 6A the neural network module 622 and output module 624 are depicted as separate entities, it will be understood that in some implementations they may be integrated together.

Although not shown in FIG. 66A, the sensor 110 may be coupled to a memory, such as a random-access memory and/or an EEPROM memory. The memory may be coupled to the processing circuitry 620, and it may be used to store some (or all) of the coefficients and bias values of the neural network 700. Although not shown, the sensor 110 may include additional electronic circuitry interposed between the sensing module 610 and the processing circuitry 620, such as one or more amplifiers, one or more analog converters, and/or any other suitable type of circuitry that is normally found in magnetic field sensors.

FIG. 7 is a diagram of a neural network 700, according to aspects of the disclosure. According to the example of FIG. 7, the neural network 700 includes an input layer 710, a first hidden layer 720, a second hidden layer 730, and an output layer 740. The input layer 710 may include a plurality of input neurons 701. The first hidden layer 720 may include a plurality of hidden neurons 703. The second hidden layer 730 may include a plurality of hidden neurons 705. The output layer 740 may include a plurality of output neurons 707. Although in the example of FIG. 7, the neural network 700 includes a fully-connected neural network, alternative implementations are possible in which the neural network 700 includes another type of neural network, such as a convolutional neural network, etc. Although in the example of FIG. 6A, the sensing module 610 is a 3-dimensional sensing module, alternative implementations are possible in which the sensing module 610 is a 2-dimensional module. In such implementations, the sensing module 610 may include only two sensing elements, and the input layer 710 of the neural network 700 (shown in FIG. 7) may have only two input nodes. Furthermore, in some implementations, the sensing module 610 may be a 1-dimensional sensing module, in which case the input layer 710 of the neural network 700 may include only one input node.

The input layer 710 may include an input neuron 701*a*, an input neuron 701*b*, and an input neuron 701*c*. The input neuron 701*a* may receive the signal 611 (shown in FIG. 6A), and forward it to each of the hidden neurons 703. The input neuron 701*b* may receive the signal 612 (shown in FIG. 6A), and forward it to each of the hidden neurons 703. The input neuron 701*c* may receive the signal 613 (shown in FIG. 6A), and forward it to each of the hidden neurons 703.

The first hidden layer 720 may include 12 hidden neurons 703. Each of the hidden neurons 703 may receive as input the signals 611, 612, and 613 and generate a respective output value. The output value may be generated based on the signals 611-613, a respective set of weight coefficients that is associated with the hidden neuron 703, and a respective bias coefficient that is associated with the hidden neuron 703. In some implementations, at least two of the hidden neurons 703 may be associated with different sets of weight coefficients. Additionally or alternatively, in some implementations, at least two of the hidden neurons 703 may be associated with different bias coefficients. Although in the present example the first hidden layer 720 includes 12 neurons, it will be understood that the present disclosure is not limited to any specific number of hidden neurons being included in the first hidden layer 720.

The second hidden layer 730 may include 4 hidden neurons 705. Each of the hidden neurons 705 may receive as input the values output from each of the hidden neurons 703. Each of the hidden neurons 705 may generate an output value based on the output of the hidden neurons 703, a respective set of weight coefficients that is associated with the hidden neuron 705, and a respective bias coefficient that is associated with the hidden neuron 705. In some implementations, at least two of the hidden neurons 705 may be associated with different sets of weight coefficients. Additionally or alternatively, in some implementations, at least two of the hidden neurons 705 may be associated with different bias coefficients. Although in the present example the hidden layer 730 includes 4 neurons, it will be understood that the present disclosure is not limited to any specific number of hidden neurons being included in the second hidden layer 730.

The output layer 740 may include 7 output neurons 707. Each of the output neurons 707 may be associated with a different positional domain. Each of the output neurons may be arranged to generate a value that indicates the probability of the magnetic field source 130 being situated in the output neuron's 707 associated positional domain. The first output neuron 707 (from top to bottom) may be associated with the first positional domain (shown in FIGS. 2-3C), and the value generated by the first output neuron 707 may identify the probability of the sensor 110 being situated in the first positional domain. The second output neuron 707 (from top to bottom) may be associated with the second positional domain (shown in FIGS. 2-3C), and the value generated by the second output neuron 707 may identify the probability of the sensor 110 being situated in the second positional domain. The third output neuron 707 (from top to bottom) may be associated with the third positional domain (shown in FIGS. 2-3C), and the value generated by the third output neuron 707 may identify the probability of the sensor 110 being situated in the second positional domain. As noted above with respect to FIG. 6, the values generated by the output neurons 707 may together form the signal 623, when normalized by block 709.

Although in the example of FIG. 7 the output layer 740 includes seven output neurons 707, it will be understood that the output layer 740 may include any number of output neurons. For example, in some implementations, the output layer 740 may include only three output neurons. In some implementations, when the number of output neurons 707 is greater than the number of available positional domains (as is in the example of FIG. 7), some of the output neurons 707 may be disabled to cause the total number of active output neurons 707 to equal the number of available positional domains. When any of the output neurons are implemented by using dedicated logic (or circuitry) disabling the neurons may include turning off the circuitry to save power. When any of the neurons are implemented, at least in part, in software, disabling the neurons may include discarding the output of the neurons or abstaining from evaluating the neurons.

Each of the hidden neurons 703 may have an affine function $Z_{703}$, which is defined by Equation 1 below:

$$Z_{703}=B+\Sigma_{i=1}^{x}\text{input\_signal}_i w_i \quad (1)$$

where B is the bias coefficient for the neuron, input_signal is one of the signals 611, 612, and 613, and $w_i$ is a weight coefficient corresponding to the i-th input signal. According to the present example, the affine function $Z_{703}$ computes the weighted sum of the signals 611, 612, and 613 and adds the bias coefficient B to the weighted sum. As noted above, each of the hidden neurons 703 may evaluate affine function $Z_{703}$ based on a bias value and a set of weight coefficients that are associated with that neuron. In other words, in some implementations, at least some of the hidden neurons 703 may use different weight coefficients and/or different bias values to evaluate the affine function $Z_{703}$.

Each of the hidden neurons 703 may produce an output value in accordance with Equation 2 below:

$$\text{output}=A_{703}(Z_{703}) \quad (2)$$

where output is the output value of the hidden neuron 703, $A_{703}$ is the activation function for the hidden neuron 703, and $Z_{703}$ is the result of the affine function for the hidden neuron 703.

The activation function $A_{703}$ for any of the hidden neurons 703 may be the ReLu function, which is defined by Equation 3 below:

$$ReLU(x) = \begin{cases} 0, & \text{for } x \leq 0 \\ x, & \text{for } ex > 0 \end{cases} \quad (3)$$

The ReLu function may have an output range from zero to infinity. Using the ReLu function is advantageous because it is not computationally intensive. However, it will be understood that the present disclosure is not limited to using any specific activation function for the hidden neurons 703.

Each of the hidden neurons 705 may have an affine function $Z_{705}$, which is defined by Equation 4 below:

$$Z_{705}=B+\Sigma_{i=1}^{x}\text{input\_value}_i w_i \quad (4)$$

where B is the bias coefficient for the neuron, input_value is the output value of the i-th hidden neuron 703 in the hidden layer 720, and $w_i$ is a weight coefficient corresponding to the i-th hidden neuron. According to the present example, the affine function $Z_{705}$ computes the weighted sum of the output of the hidden neurons 703 and adds the bias coefficient B to the weighted sum. As noted above, each of the hidden neurons 705 may evaluate affine function $Z_{705}$ based on a bias value and a set of weight coefficients that are associated with that neuron. In other words, in some implementations, at least some of the hidden neurons 705 may use different weight coefficients and/or different bias values to evaluate the affine function $Z_{705}$.

Each of the hidden neurons 705 may produce an output value in accordance with Equation 5 below:

$$\text{output}=A_{705}(Z_{705}) \quad (5)$$

where output is the output value of the hidden neuron 705, $A_{705}$ is the activation function for the hidden neuron 705, and $Z_{705}$ is the result of the affine function for the hidden neuron 705. The activation function $A_{705}$ for any of the hidden neurons 705 may be the ReLu function, which is defined by Equation 3, above. However, it will be understood that the present disclosure is not limited to using any specific activation function for the hidden neurons 705.

Each of the output neurons 707 may produce an output value in accordance with Equation 6 below:

$$\text{output}=Z_{707}(x) \quad (6)$$

where output is a score that is generated by the output neuron 707, $Z_{707}$ is an affine function for the output neuron 707, and x is a vector including the output values of all hidden neurons 705. The output value that is generated by a given output neuron 707 (e.g., by evaluating a function $Z_{707}$ for the given output neuron 707) represents a score for a positional domain associated with the output neuron.

By way of example, the affine function $Z_{707}$ for any given output neuron 707 may be defined by Equation 7 below:

$$Z_{707}=B+\Sigma_{i=1}^{x}\text{input\_value}_i w_i \quad (7)$$

where B is the bias coefficient for the given output neuron, input_value is the output value of the i-th hidden neuron 705 in the hidden layer 730, and $w_i$ is a weight coefficient corresponding to the i-th output neuron. Each of the output neurons 707 may evaluate affine function $Z_{707}$ based on a bias value and a set of weight coefficients that are associated with that output neuron. In other words, in some implementations, at least some of the output neurons 707 may use different weight coefficients and/or different bias values to evaluate the affine function $Z_{707}$. It will be understood that the activation and affine functions discussed throughout the disclosure are provided as an example only. Those of ordinary skill in the art will readily appreciate, after reading this disclosure, that different affine functions and/or activation functions may be used to implement the neural network 700. Furthermore, as noted above, it will be understood that the present disclosure is not limited to training any specific type of neural network to classify a set of signals that are generated by magnetic field sensing elements into positional domains.

As noted above, together the output neurons 707 in the output layer 740 may produce a set of scores x, wherein each score in the set corresponds to a different positional domain. The set x may be normalized by block 709. Block 709 may evaluate the SoftMax function based on the set x. In the present example, the set x includes the scores generated by the first three output neurons 707. This is so because, in the present example, the neural network 700 is trained to recognize only three positional domains. However, it will be readily appreciated that if the neural network is trained to recognize more than three positional domains, additional output neurons would be enabled, and their output would also be included in the set x. In some respects, the SoftMax function may be regarded as an activation function of each of the output neurons 707 and/or the output layer 740. Accordingly, it will be understood that the SoftMax function is represented by a separate block in FIG. 7 (e.g., block 709) for the purpose of clarity only. The SoftMax function may be described by Equation 8 below:

$$S_i(x) = \frac{e^{x_i}}{\sum_{j=1}^{N} e^{x_j}} \qquad (8)$$

where $S_i$ is the normalized value of the score that is output by the i-th output neuron 707 in the output layer 740, $x_i$ is the score that is output from the i-th output neuron 707 in the output layer 740 (or the i-th member of the set x), $x_j$ is the j-th member of the set x, and N is the number of output neurons 707 that are used to identify the positional domain of the sensor 110 (or the size of the set x). According to the present example, the SoftMax function normalizes the set x into a probability distribution whose total sums up to 1. As a result of evaluating the SoftMax function, block 709 may output a set of values, where each value is associated with a different positional domain, and each value represents a probability of the sensor 110 being in the positional domain that is associated with the value. Although in the present example the SoftMax function is used to normalize the scores generated by the output layer 740, it will be understood that the present disclosure is not limited to any specific activation function being used. Furthermore, it will be understood that, in some implementations, the normalization step that is performed by block 709 may be altogether omitted or performed in another component (or module) of the sensor 110.

Figure 8A:
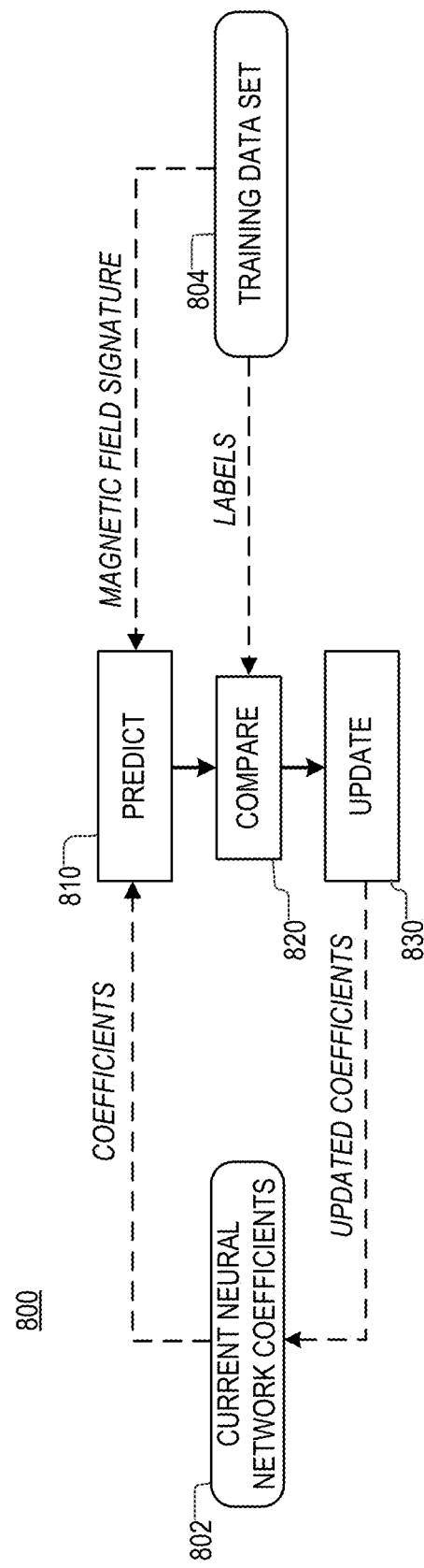
FIG. 8A is a diagram illustrating a process for training the neural network of FIG. 7, according to aspects of the disclosure.

FIG. 8A is a flowchart of an example of a process 800 for training the neural network 700 (shown in FIG. 7), according to aspects of the disclosure. The process 800 may be performed on a computing device that is separate from the sensor 110. The process 800 is described in the context of a memory location 802 and a memory location 804 of the computing device.

Memory location 802 may store a set of neural network coefficients. The set of neural network coefficients may include one or more of: (i) a plurality of coefficient sets, wherein each coefficient set corresponds to a respective neuron in the neural network 700 and/or (ii) a plurality of bias coefficients, wherein each bias coefficients correspond to a different neuron in the neural network 700. As is discussed further below, the neural network coefficients that are stored at memory location 802 may be iteratively updated until a predetermined convergence criterion is met, at which time the neural network coefficients that are stored in memory location 802 become final and are subsequently used by the neural network 700.

Memory location 804 may store a training data set 850, which is shown in FIG. 8B. The training data set 850 may include a plurality of entries 856. Each entry 856 may include a respective magnetic field signature 852 and a corresponding label 854 that is mapped to the respective magnetic field signature. Each magnetic field signature 852 may include a value of an x-axis component of a magnetic field, a value of a y-axis component of the magnetic field, and a value of a z-axis component of a magnetic field.

Returning to FIG. 8A, at step 810, the process 800 obtains magnetic field signature from the training data set 850 (shown in FIG. 8B). In addition, the process 800 obtains the set of neural network coefficients that is currently stored at memory location 802, as well as the magnetic field signature 852 that is stored in a given one of the entries 856 of the training data set 850. Afterwards, the process 800 evaluates the neural network 700 based on the obtained set of neural network coefficients and the magnetic field signature 852 to produce a prediction. The prediction may be the final output of the neural network 700, and it may include a set of probability values, wherein each probability value is generated by a different output neuron 707 of the neural network 700, and corresponds to a different positional domain. At step 820, the process 800 retrieves a label 854 from the given entry 856. Afterwards, the process 800 compares the retrieved label to the prediction (determined at step 810). At step 830, the process 800 updates the set of neural network coefficients that are stored at memory location 802 based on the outcome of the comparison (performed at step 820). As noted above, the process 800 may continue to update the neural network coefficients (stored at memory location 802), until a convergence criterion is satisfied.

Figure 9:
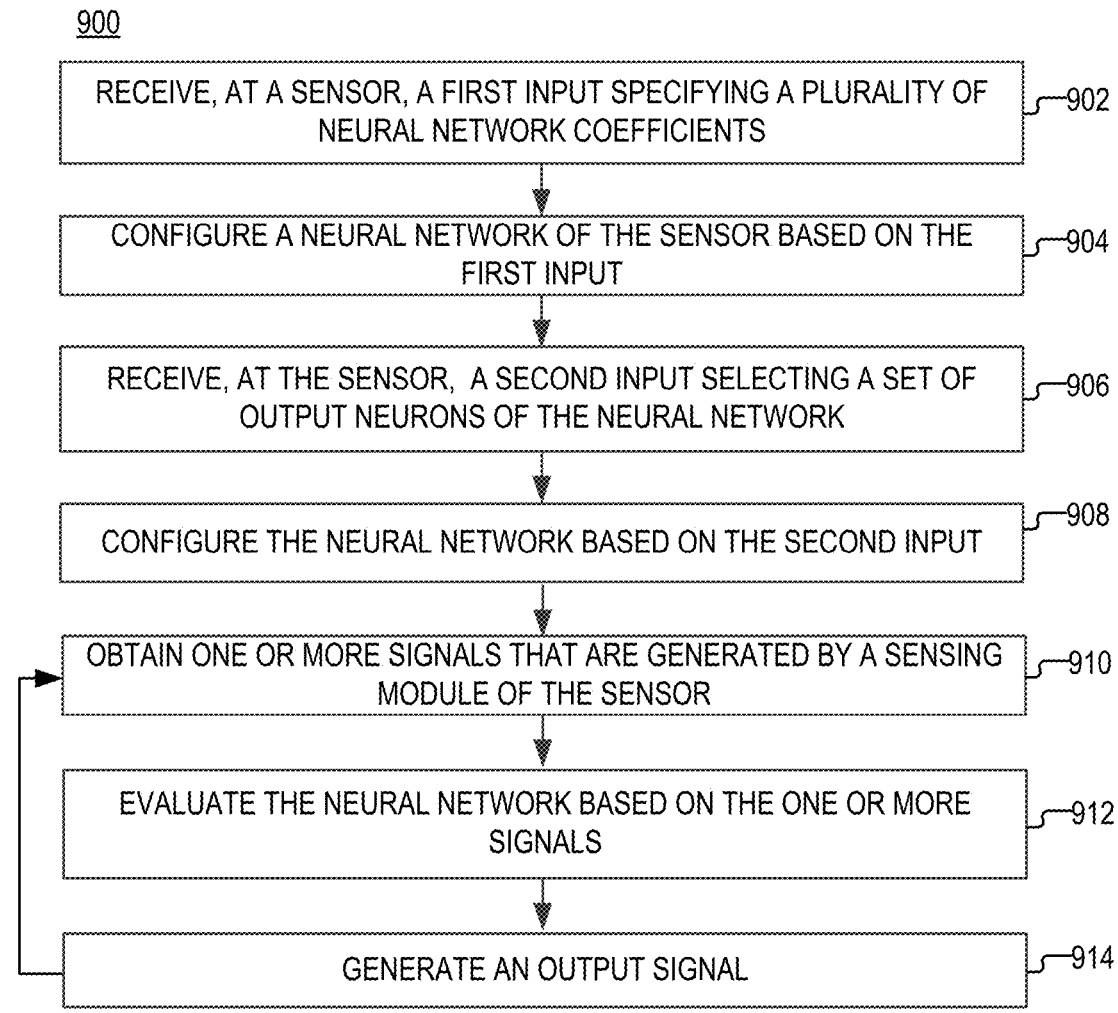
FIG. 9 is a flowchart of an example of a process, according to aspects of the disclosure.

FIG. 9 is a flowchart of an example of a process 900, according to aspects of the disclosure.

At step 902, the processing circuitry 620 receives a first user input specifying a plurality of neural network coefficients. As noted above, the first user input may include: (i) one or more weight coefficient sets, wherein each weight coefficient set corresponds to a respective neuron in the neural network 700, and/or (ii) a plurality of bias coefficients, wherein each bias coefficient corresponds to a respective neuron in the neural network 700. In some implementations, the first user input may be provided via an I2C interface and/or another communication (or input) interface of the sensor 110.

At step 904, the processing circuitry 620 configures the neural network 700 based on the first input. Configuring the neural network 700 based on the first input may include taking any action that causes the neural network module 622 to evaluate the neural network 700 in accordance with the neural network coefficients that are received at step 902. In some implementations, configuring the neural network module 622 may include storing the neural network coefficients (and/or bias values) in one or more predetermined memory locations.

At step 906, the processing circuitry 620 receives a second user input selecting a set of the output neurons 707 that are part of the output layer 740 of the neural network 700. In some implementations, the first user input may be provided via an I2C interface and/or another communication (or input) interface of the sensor 110. Additionally or alternatively, in some implementations, the second user input may include a set of output neuron identifiers corresponding to the output neurons 707 that are being selected.

At step 908, the processing circuitry 620 configures the neural network 700 based on the second input. Configuring the neural network 700 based on the second input may include taking any action that causes the neural network module 622 to generate the signal 623 based on the selected output neurons 707. By way of example, in some implementations, the processing circuitry 620 may disable output neurons 707 that are not selected by the second input. As another example, the processing circuitry may discard output values generated by non-elected output neurons 707.

At step 910, the neural network module 622 receives the signals 611-613 from the sensing module 610. In some implementations, receiving the signals 611, 612, and 613 may include: (i) receiving one or more digital samples of the signal 611, (ii) receiving one or more digital samples of the signal 612, and (iii) receiving one or more digital samples of the signal 613.

At step 912, the neural network module 622 evaluates the neural network 700 based on the received signals 611-613 to produce the signal 623. In some implementations, the signal 623 may include only probability values that are generated by output neurons which are selected by the second input. In some implementations, each of the probability values may indicate the likelihood of the magnetic field source 130 being situated in a corresponding positional domain.

At step 914, the output module 624 generates the signal 625 based on the signal 623. As noted above, the signal 625 may identify the positional domain where the magnetic field source 130 is currently located. In some implementations, the signal 625 may identify the positional domain associated with the output neuron 707 of the neural network 700 that has generated the highest probability in the set (produced at step 912). In some implementations, the signal 625 may be generated by using the argmax function in a well-known fashion.

FIG. 9 is provided as an example only. At least some of the steps discussed with respect to FIG. 9 can be performed in a different order, performed concurrently, or altogether omitted. Although in the example of FIG. 9 the sensor 110 is customizable at the point of deployment, alternative implementations are possible in which the sensor 110 is not customizable. In such implementations, the coefficients and bias values of the neural network 700 may be set in the factory. Furthermore, when the sensor 110, the set of output neurons 707 that would be used to generate the signal 623 may be selected in the factory and/or not restricted at all. Stated succinctly, the present disclosure is not limited to any specific implementation of the sensor 110.

Figure 10:
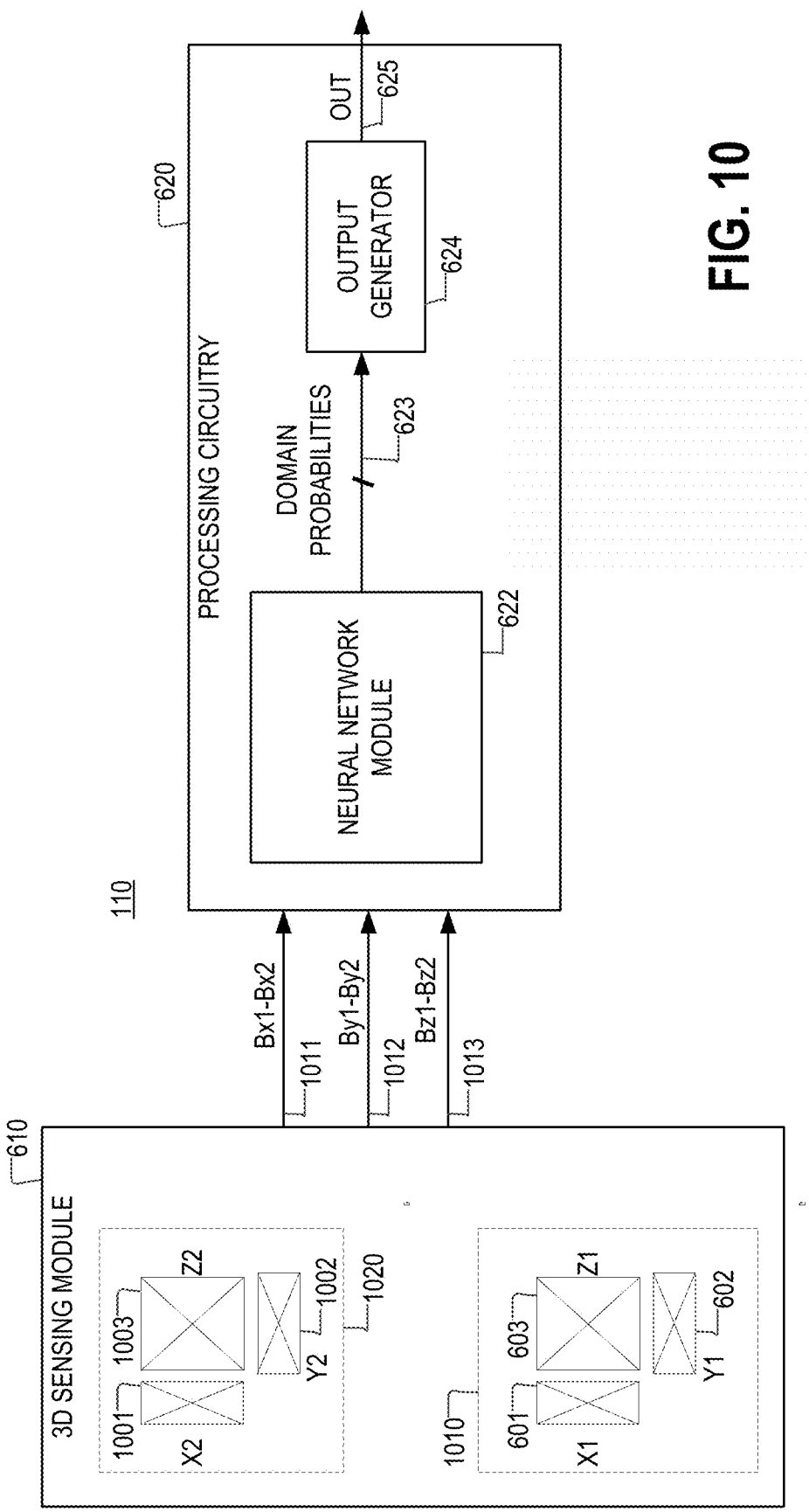
FIG. 10 is a diagram of an example of a process, according to aspects of the disclosure.

FIG. 10 is a diagram of the sensor 110, in accordance with another implementation. In this implementation, the sensing module 610 may include two sets of sensing elements—namely, sets 1010 and 1020. This is in contrast to the implementation of the sensor 110, which is shown in FIG. 6, and in which the sensing module 610 includes only one sensing element for each magnetic field axis.

The set 1010 may include sensing elements 601, 602, and 603. As noted above, the first sensing element 601 may have a first axis of maximum sensitivity 651 (shown in FIG. 6B), and it may be configured to output a signal that indicates the magnitude of a first component (e.g., an x-axis component) of the magnetic field that is produced by the magnetic field source 130. The second sensing element 602 may have a second axis of maximum sensitivity 652 (shown in FIG. 6B), and it may be configured to output a signal that indicates the magnitude of a second component (e.g., a y-axis component) of the magnetic field that is produced by the magnetic field source 130. The third sensing element 603 may have a second axis of maximum sensitivity 653 (shown in FIG. 6B), and it may be configured to output a signal that indicates the magnitude of a third component (e.g., a z-axis component) of the magnetic field that is produced by the magnetic field source.

The set 1020 may include sensing elements 1001, 1002, and 1003. The first sensing element 1001 may have a first axis of maximum sensitivity 651 (shown in FIG. 6B), and it may be configured to output a signal that indicates the magnitude of a first component (e.g., an x-axis component) of the magnetic field that is produced by the magnetic field source 130. The second sensing element 602 may have a second axis of maximum sensitivity 652 (shown in FIG. 6B), and it may be configured to output a signal that indicates the magnitude of a second component (e.g., a y-axis component) of the magnetic field that is produced by the magnetic field source 130. The sensing element 603 may have a third axis of maximum sensitivity 653 (shown in FIG. 6B), and it may be configured to output a signal that indicates the magnitude of a second component (e.g., a z-axis component) of the magnetic field that is produced by the magnetic field source.

The sensing module 610 may be configured to provide signals 1011, 1012, and 1013 to the processing circuitry 620. The signal 1011 may be equal to (or otherwise based on) the difference between the outputs of sensing elements 1001 and 601. The signal 1012 may be equal to (or otherwise based on) the difference between the outputs of sensing elements 1002 and 602. And the signal 1013 may be equal to (or otherwise based on) the difference between the outputs of the sensing elements 1003 and 603. In some respects, the signal 1001 may be a differential signal that is indicative of the magnitude of the first component (e.g., the x-axis component) of the magnetic field that is produced by the magnetic field source 130. The signal 1002 may be a differential signal that is indicative of the magnitude of the second component (e.g., the y-axis component) of the magnetic field that is produced by the magnetic field source 130. The signal 1002 may be a differential signal that is indicative of the magnitude of the third component (e.g. a z-axis component) of the magnetic field that is produced by the magnetic field source 130.

The signals 1011, 1012, and 1013 may be provided to the processing circuitry 620, as shown. Specifically, the signal 1011 may be provided to the input neuron 701a of the neural network 700 (shown in FIG. 7). The signal 1012 may be provided to the input neuron 701b of the neural network 700 (shown in FIG. 7). And, the signal 1013 may be provided to the input neuron 701b of the neural network 700 (shown in FIG. 7). The signals 1011, 1012, and 1013 may be used to generate the signal 625 in the manner discussed above with respect to FIGS. 7-9. As noted above, the neural network 700 may be implemented by the neural network module 622 of the processing circuitry 620. According to the present example, the phrase "providing a signal to a neural network neuron" shall mean evaluating the neural network neuron based on one or more samples of the signal.

Any of the sensing elements 601, 602, 603, 1001, 1002, 1003 (shown in FIGS. 6 and 10) can include one or more magnetic field sensing elements, such as Hall effect elements, magnetoresistance elements, or magnetoresistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Figure 11:
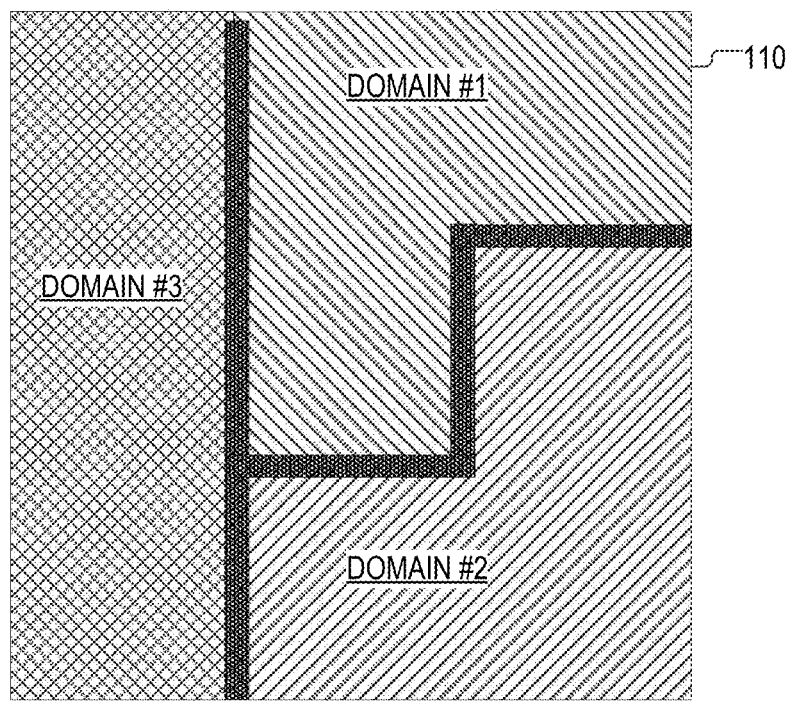
FIG. 11 is a diagram illustrating an example of a set of positional domains, according to aspects of the disclosure.

In some instances, the sensor 100 may overlap with two positional domains (e.g., when the sensor 100 is on the boundary between the two domains). To address this situation, one or more boundary domains may be defined on the boundaries between domains 1-3 (shown in FIGS. 2 and 11), and the neural network 700 may be trained to recognize the boundary domain(s) in addition to domains 1-3. When the value of the signal that is output by the sensor 100 indicates that the sensor is situated in a boundary domain, this may alert the user that sensor 100 cannot be reliably classified as being situated in one of domains 1-3.

Figure 12:
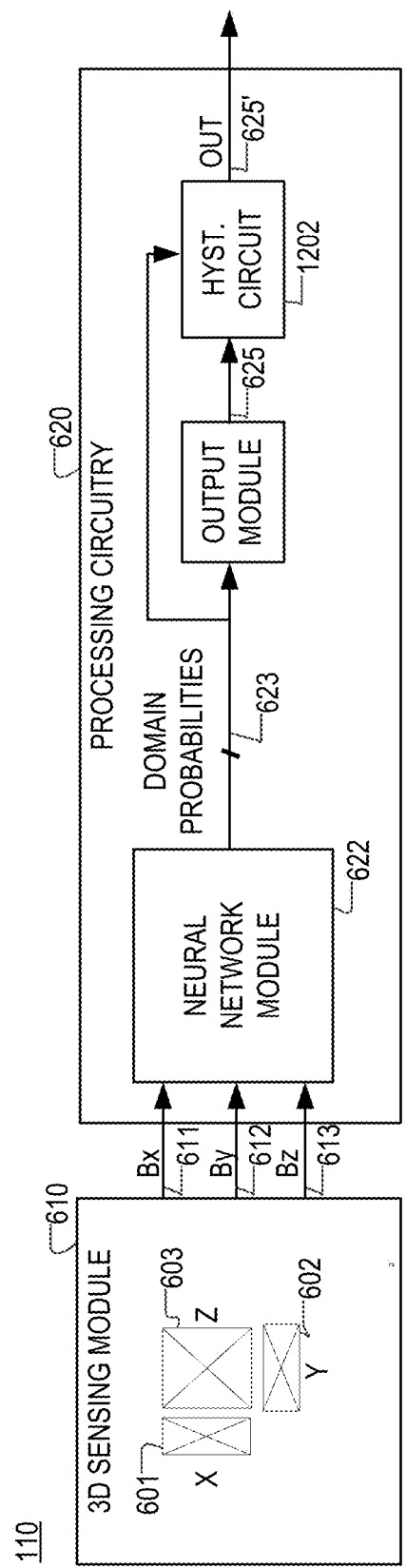
FIG. 12 is a diagram illustrating an example of a magnetic field sensor, according to aspects of the disclosure.

Another approach for addressing the situation in which the sensor 100 overlaps with two domains is to add a hysteresis circuit 1202 (shown in FIG. 12) to the sensor 110. The hysteresis circuit 1202 may receive the signal 623 (that is provided by the neural network module 622) and the signal 624 (that is generated by the output module). The hysteresis circuit 623 may output a signal 625' based on the signal 625. In the example of FIG. 12, signal 625' (rather than the signal 625) is the signal that is output from the sensor 100. In operation, the hysteresis circuit 1202 may iteratively update the value of the signal 625'. At each iteration, the hysteresis circuit 1202 may receive: (i) a value of the signal 625 and (ii) a value of the signal 623 that is used as a basis for generating the signal 625. As noted above, the signal 623 may include a set of domain probabilities. Next, the hysteresis circuit 1202 may determine the distance between the largest probability and the second largest probability in the set of domain probabilities that is represented by the signal 623. If the distance is greater than a threshold, the hysteresis circuit 1202 may update the value of the 625' to equal the received value of signal 625. Otherwise, if the distance is not greater than the threshold, the hysteresis circuit 1202 may leave the value of the signal 625' unchanged (i.e., the hysteresis circuit 1202 may continue to output a previous value of the signal 625')

The system may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, whereupon execution, instructions in the computer program cause the computer to operate in accordance with the processes. A non-transitory machine-readable medium may include but is not limited to a hard drive, compact disc, flash memory, non-volatile memory, volatile memory, magnetic diskette and so forth but does not include a transitory signal per se.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A sensor, comprising:
a magnetic field sensing module that is configured to generate a plurality of signals, each signal indicating a magnetic flux density of a different component of a magnetic field that is produced by a magnetic field source; and
a processing circuitry that is configured to:
receive the plurality of signals from the magnetic field sensing module;
evaluate a neural network based on the plurality of signals to obtain a plurality of probabilities, each of the plurality of probabilities indicating a likelihood of the magnetic field source being positioned in a different one of a plurality of positional domains each of the plurality of positional domains corresponding to a different region on a surface of the magnetic field source, such that the magnetic field source is positioned in ay given one of the plurality of positional domains when the region corresponding to the given positional domain is situated in greater proximity to the magnetic field sensing module than the regions corresponding to the remaining ones of the plurality of positional domains; and
generate an output signal based on the plurality of probabilities, the output signal encoding an identifier of a current positional domain of the magnetic field source, the current positional domain of the magnetic field source being one of the plurality of positional domains where the magnetic field source is currently positioned.

2. The sensor of claim 1, wherein the neural network includes a plurality of output neurons, each of the plurality of output neurons being arranged to generate a different one of the plurality of probabilities.

3. The sensor of claim 1, wherein:
the processing circuitry is further configured to receive an input selecting fewer than all output neurons that are available in the neural network, and
the output signal is generated only based on probabilities that are generated by the output neurons selected by the input.

4. The sensor of claim 1, wherein at least one of the plurality of positional domains is discontinuous.

5. The sensor of claim 1, wherein generating the output signal includes:
identifying a largest one of the plurality of probabilities; and
identifying one of the plurality of positional domains that corresponds to the largest one of the plurality of probabilities.

6. The sensor of claim 1, wherein the magnetic field sensing module includes:

a first magnetic field sensing element having a first axis of maximum sensitivity;

a second magnetic field sensing element having a second axis of maximum sensitivity that is transverse to the first axis of maximum sensitivity; and a third magnetic field sensing element having a third axis of maximum sensitivity that is transverse to both the first axis of maximum sensitivity and the second axis of maximum sensitivity.

7. The sensor of claim 1, wherein the processing circuitry is further configured to receive respective weight coefficients for different neurons in the neural network, and the neural network is evaluated based on the respective weight coefficients.

8. The sensor of claim 1, wherein generating the output signal includes updating a value of the output signal only when a distance between a largest one of the plurality of probabilities and a second largest one of the plurality of probabilities is greater than a threshold distance.

9. The sensor of claim 1, wherein the current positional domain of the magnetic field source includes a domain that is directly adjacent to the magnetic field source.

10. A method, comprising:

generating, by a magnetic field sensing module, a plurality of signals, each signal indicating a magnetic flux density of a different component of a magnetic field that is produced by a magnetic field source;

evaluating a neural network based on the plurality of signals to obtain a plurality of probabilities, each of the plurality of probabilities indicating a likelihood of the magnetic field source being positioned in a different one of a plurality of positional domains, each of the plurality of positional domains corresponding to a different region on a surface of the magnetic field source, such that the field source is positioned in any given one of the plurality of positional domains when the region corresponding to the given positional domain is situated in greater proximity to the magnetic field sensing module than the regions corresponding to the remaining ones of the plurality of positional domains; and generating an output signal based on the plurality of probabilities, the output signal encoding an identifier of a current positional domain of the magnetic field source, the current positional domain of the magnetic field source being one of the plurality of positional domains where the magnetic field source is currently positioned.

11. The method of claim 10, wherein the neural network includes a plurality of output neurons, each of the plurality of output neurons being arranged to generate a different one of the plurality of probabilities.

12. The method of claim 10, further comprising receiving an input selecting fewer than all output neurons that are available in the neural network, wherein the output signal is generated only based on probabilities that are generated by the output neurons selected by the input.

13. The method of claim 10, wherein at least one of the plurality of positional domains is discontinuous.

14. The method of claim 10, wherein generating the output signal includes:

identifying a largest one of the plurality of probabilities; and identifying one of the plurality of positional domains that corresponds to the largest one of the plurality of probabilities.

15. The method of claim 10, wherein the magnetic field sensing module includes:

a first magnetic field sensing element having a first axis of maximum sensitivity;

a second magnetic field sensing element having a second axis of maximum sensitivity that is transverse to the first axis of maximum sensitivity; and a third magnetic field sensing element having a third axis of maximum sensitivity that is transverse to both the first axis of maximum sensitivity and the second axis of maximum sensitivity.

16. The method of claim 10, further comprising receiving an input specifying a plurality of weight coefficients, wherein the neural network is evaluated based on the respective weight coefficients.

17. The method of claim 10, wherein generating the output signal includes updating a value of the output signal only when a distance between a largest one of the plurality of probabilities and a second largest one of the plurality of probabilities is greater than a threshold distance.

18. The method of claim 10, wherein the current positional domain of the magnetic field source includes a domain that is directly adjacent to the magnetic field source.

19. A sensor, comprising:

a sensing module configured to generate a plurality of signals, each of the signals indicating a magnetic flux density of a different component of a magnetic field that is produced by a magnetic field source; and a processing circuitry that is configured to:

receive the plurality of signals; and generate an output signal based on the plurality of signals, the output signal encoding an identifier of a current positional domain of the magnetic field source, the current positional domain being one of a plurality of positional domains, each of the plurality of positional domains corresponding to a different region on a surface of the magnetic field source, the current positional domain being one of the plurality of positional domains whose respective region is situated in greater proximity to the sensing module than the respective regions of the remaining ones of the plurality of positional domains, wherein the current positional domain of the magnetic field source is discontinuous.

20. The sensor of claim 19, wherein:

the processing circuitry is further configured to evaluate a neural network based on the plurality of signals to obtain a plurality of probabilities, each of the plurality of probabilities indicating a likelihood of the magnetic field source being positioned in a different one of the plurality of positional domains, and the output signal is generated based on the plurality of probabilities.

21. A method, comprising:

a magnetic field sensing module that is configured to generate a plurality of signals, each signal indicating a magnetic flux density of a different component of a magnetic field that is produced by a magnetic field source;

a processing circuitry that is configured to:

receive the plurality of signals from the magnetic field sensing module; and generate an output signal based on the plurality of signals, the output signal encoding an identifier of a current positional domain of the magnetic field source, the current positional domain being one of a plurality of positional domains, each of the plurality of positional domains corresponding to a different region on a surface of the magnetic field source the current positional domain being one of the plurality of positional domains whose respective region is situated in greater proximity to the sensing module than the respective regions of the remaining ones of the plurality of positional domains, wherein the current positional domain of the magnetic field source is discontinuous.

22. The method of claim 21, further comprising evaluating a neural network based on the plurality of signals to obtain a plurality of probabilities, each of the plurality of probabilities indicating a likelihood of the magnetic field source being positioned in a different one of the plurality of positional domains, wherein the output signal is generated based on the plurality of probabilities.

23. The system of claim 1, wherein the magnetic field sensing module includes a plurality of magnetic field sensing elements, each magnetic field sensing element having a different axis of maximum sensitivity.

24. The method of claim 10, wherein the magnetic field sensing module includes a plurality of magnetic field sensing elements, each magnetic field sensing element having a different axis of maximum sensitivity.

25. The system of claim 19, wherein the magnetic field sensing module includes a plurality of magnetic field sensing elements, each magnetic field sensing element having a different axis of maximum sensitivity.

26. The method of claim 21, wherein the magnetic field sensing module includes a plurality of magnetic field sensing elements, each magnetic field sensing element having a different axis of maximum sensitivity.

* * * * *